(12) United States Patent
Asai

(10) Patent No.: US 10,008,643 B2
(45) Date of Patent: Jun. 26, 2018

(54) LIGHT EMITTING DEVICE HAVING DIFFERENT TYPES OF PHOSPHOR MATERIAL

(71) Applicant: NICHIA CORPORATION, Anan-shi, Tokushima (JP)

(72) Inventor: Kenji Asai, Naruto (JP)

(73) Assignee: NICHIA CORPORATION, Anan-shi (JP)

( * ) Notice: Subject to any disclaimer, the term of this patent is extended or adjusted under 35 U.S.C. 154(b) by 0 days. days.

(21) Appl. No.: 15/384,787

(22) Filed: Dec. 20, 2016

(65) Prior Publication Data

US 2017/0179347 A1    Jun. 22, 2017

(30) Foreign Application Priority Data

Dec. 22, 2015    (JP) .................................. 2015-249862

(51) Int. Cl.

| | |
|---|---|
| *H01L 33/50* | (2010.01) |
| *C09K 11/08* | (2006.01) |
| *C09K 11/61* | (2006.01) |
| *C09K 11/66* | (2006.01) |
| *C09K 11/77* | (2006.01) |

(52) U.S. Cl.
CPC ........ *H01L 33/504* (2013.01); *C09K 11/0883* (2013.01); *C09K 11/617* (2013.01); *C09K 11/665* (2013.01); *C09K 11/7734* (2013.01); *C09K 11/7774* (2013.01); *H01L 2224/48091* (2013.01); *H01L 2224/48247* (2013.01); *H01L 2224/48257* (2013.01); *H01L 2224/73265* (2013.01); *H01L 2924/181* (2013.01)

(58) Field of Classification Search
CPC . H01L 33/504; C09K 11/0883; C09K 11/617; C09K 11/665; C09K 11/7734; C09K 11/7774

USPC .................... 257/98; 438/22, 25, 26, 27, 29
See application file for complete search history.

(56) References Cited

U.S. PATENT DOCUMENTS

| | | |
|---|---|---|
| 2003/0006469 A1 | 1/2003 | Ellens et al. |
| 2003/0146690 A1 | 8/2003 | Ellens et al. |

(Continued)

FOREIGN PATENT DOCUMENTS

| | | |
|---|---|---|
| JP | 2003-535477 A | 11/2003 |
| JP | 2003-535478 A | 11/2003 |

(Continued)

*Primary Examiner* — Didarul Mazumder
(74) *Attorney, Agent, or Firm* — Hunton Andrews Kurth LLP

(57) ABSTRACT

A light emitting device comprises a light emitting element having an emission peak wavelength in a wavelength range of 430 nm to 470 nm, and a phosphor material comprising at least one type of phosphor selected from the group consisting of a first phosphor and a second phosphor, a third phosphor, a fourth phosphor, and a fifth phosphor having respective compositions represented by formulas (I)-(V):

$$(x-s)\mathrm{MgO}\cdot(s/2)\mathrm{Sc}_2\mathrm{O}_3\cdot y\mathrm{MgF}_2\cdot u\mathrm{CaF}_2\cdot(1-t)\mathrm{GeO}_2\cdot(t/2)$$
$$\mathrm{M}^t{}_2\mathrm{O}_3{:}z\mathrm{Mn}^{4+} \quad (\mathrm{I})$$

$$\mathrm{A}_2[\mathrm{M}_{1-p}\mathrm{F}_6]{:}p\mathrm{Mn}^{4+} \quad (\mathrm{II})$$

$$\mathrm{Lu}_3\mathrm{Al}_5\mathrm{O}_{12}{:}\mathrm{Ce} \quad (\mathrm{III})$$

$$(\mathrm{Sr},\mathrm{Ca})\mathrm{AlSiN}_3{:}\mathrm{Eu} \quad (\mathrm{IV})$$

$$(\mathrm{Ca},\mathrm{Sr},\mathrm{Ba})_8\mathrm{MgSi}_4\mathrm{O}_{16}(\mathrm{F},\mathrm{Cl},\mathrm{Br})_2{:}\mathrm{Eu} \quad (\mathrm{V})$$

In the formulas (I)-(V), $\mathrm{M}^t$ is at least one of Al, Ga, and In; x, y, z, s, t, and u each satisfy $2 \le x \le 4$, $0 < y < 1.5$, $0 < z < 0.05$, $0 \le s \le 0.5$, $0 < t < 0.5$, and $0 \le u < 1.5$; A is at least one of K, Li, Na, Rb, Cs, and $\mathrm{NH}_4$; M is at least one type of element from group 4 elements and group 14 elements; and p satisfies $0 < p < 0.2$.

24 Claims, 5 Drawing Sheets

(56) References Cited

U.S. PATENT DOCUMENTS

| | | | | |
|---|---|---|---|---|
| 2007/0259206 A1* | 11/2007 | Oshio | ............... | C04B 35/581 |
| | | | | 428/690 |
| 2009/0243467 A1* | 10/2009 | Shimizu | ............ | C09K 11/7734 |
| | | | | 313/503 |
| 2012/0043552 A1 | 2/2012 | David et al. | | |
| 2015/0349213 A1* | 12/2015 | Hosokawa | ........... | H01L 33/502 |
| | | | | 257/98 |
| 2016/0009991 A1 | 1/2016 | Kaide et al. | | |
| 2016/0126221 A1* | 5/2016 | Windisch | ........... | H01L 25/0753 |
| | | | | 257/89 |
| 2016/0149095 A1 | 5/2016 | Onuma et al. | | |

FOREIGN PATENT DOCUMENTS

| | | |
|---|---|---|
| JP | 2009-221317 A | 10/2009 |
| JP | 2011-159809 A | 8/2011 |
| JP | 2013-536583 A | 9/2013 |
| JP | 2014-060328 A | 4/2014 |
| JP | 2015-228419 A | 12/2015 |
| JP | 2016-027644 A | 2/2016 |
| JP | 2016-028126 A | 2/2016 |
| JP | 2016-072614 A | 5/2016 |
| WO | 2014-203841 A1 | 12/2014 |

\* cited by examiner

LIGHT EMITTING DEVICE HAVING DIFFERENT TYPES OF PHOSPHOR MATERIAL

CROSS-REFERENCE TO RELATED APPLICATION

This application claims priority to Japanese Patent Application No. 2015-249862 filed on Dec. 22, 2015. The entire disclosure of Japanese Patent Application No. 2015-249862 is hereby incorporated herein by reference.

BACKGROUND

Technical Field

The present disclosure relates to a light emitting device.

Description of the Related Art

Light emitting devices that use light emitting elements, called light emitting diodes (hereinafter, also referred to as "LEDs"), have been gaining attention. Various types of light emitting devices that use LEDs and that emit white light have been known. An example thereof is a light emitting device formed from a combination of an LED emitting blue light and a phosphor emitting yellow light. This is a light emitting device emitting white light by mixing the colors of the blue light of the blue LED and the yellow light of the phosphor that has been excited by the blue light.

With the light emitting device formed from a combination of the light emitting element emitting the blue light and the phosphor emitting the yellow light, although high radiant intensity in the visible light region and high luminous efficacy are achieved, radiant intensity in the blue-green region and in the red region may not be sufficiently achieved. Because of this, there is room for further improvement in the color rendering index average, which is an index of color appearance of an irradiated object (color rendering index).

The evaluation procedure of the color rendering index of a light source is stipulated by JIS Z 8726 and is performed by calculating the numerical value of the difference in color ΔEi (i is an integer of 1 to 15) for cases where a test color having a particular reflectance characteristics (R1 to R15) is measured using each of test light source or reference light source. Note that the upper limit of the color rendering index Ri (i is an integer of 1 to 15) is 100. That is, a smaller difference in color between the test light source and the reference light source having a color temperature corresponding thereto results in a higher color rendering index that is closer to 100.

Regarding the description above, light emitting devices that use an LED emitting blue light and two types of phosphors emitting yellow to green light have been proposed and are said to be able to achieve excellent color reproducibility (e.g. see JP 2003-535477 A and JP 2003-535478 A).

SUMMARY

A light emitting device comprising: a light emitting element having an emission peak wavelength in a wavelength range of 430 nm to 470 nm, and a phosphor material containing: at least one type of phosphor selected from the group consisting of a first phosphor having composition represented by Formula (I) below and a second phosphor having composition represented by Formula (II) below, a third phosphor having composition represented by Formula (III) below, a fourth phosphor having composition represented by Formula (IV) below, and a fifth phosphor having composition represented by Formula (V) below:

$$(x-s)\text{MgO} \cdot (s/2)\text{Sc}_2\text{O}_3 \cdot y\text{MgF}_2 \cdot u\text{CaF}_2 \cdot (1-t)\text{GeO}_2 \cdot (t/2)\text{M}^t{}_2\text{O}_3 : z\text{Mn}^{4+} \quad (\text{I})$$

$$A_2[M_{1-p}F_6]:p\text{Mn}^{4+} \quad (\text{II})$$

$$\text{Lu}_3\text{Al}_5\text{O}_{12}:\text{Ce} \quad (\text{III})$$

$$(\text{Sr,Ca})\text{AlSiN}_3:\text{Eu} \quad (\text{IV})$$

$$(\text{Ca,Sr,Ba})_8\text{MgSi}_4\text{O}_{16}(\text{F,Cl,Br})_2:\text{Eu} \quad (\text{V})$$

In the formulas, $M^t$ is at least one type selected from the group consisting of Al, Ga, and In; x, y, z, s, t, and u each satisfy $2 \leq x \leq 4$, $0 < y < 1.5$, $0 < z < 0.05$, $0 \leq s < 0.5$, $0 < t < 0.5$, and $0 \leq u < 1.5$; A is at least one type selected from the group consisting of K, Li, Na, Rb, Cs, and $\text{NH}_4$; M is at least one type of element selected from the group consisting of group 4 elements and group 14 elements; and p satisfies $0 < p < 0.2$.

With an embodiment according to the present disclosure, a light emitting device that can achieve excellent color rendering properties can be provided.

DETAILED DESCRIPTION

Figure 1:
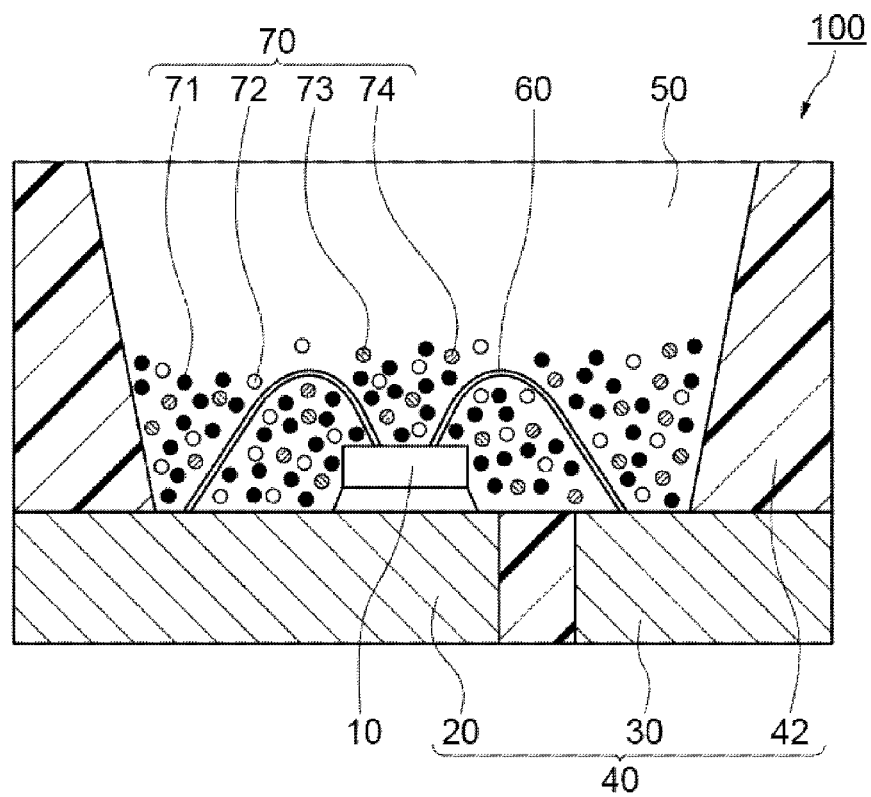
FIG. 1 is a schematic cross-sectional view illustrating an example of the light emitting device according to the present embodiment.

However, for example, when it is attempted to obtain a light source having a small difference in color of each Ri relative to a reference light source emitting light color of incandescent bulb, which is a color temperature that is particularly preferred in the European and American countries, controlling of light emission intensity of a light emitting element, which is an excitation light source, especially controlling of light emission intensity of phosphor having a longer wavelength, is not easy. This is because, when the color temperature of the target light source is that of incandescent bulb, another phosphor that at least emits red light is necessary. The half width value of the emission peak of the phosphor emitting red light is typically wide and broad. Therefore, although the difference in color of a particular Ri can be easily made smaller, it is not easy to make the differences in colors in all the Ri, i.e., the differences in colors of all of the R1 to R15, smaller and it is difficult to obtain a spectrum that is close to that of the reference light source.

An object of an embodiment of the present disclosure is to provide a light emitting device that can achieve excellent color rendering properties.

A light emitting device according to the present disclosure will be described below based on embodiments. However, the embodiments described below is to reduce the technical ideas of the present invention to practice and is not to limit the present invention thereto. Note that, in the present description, the relationship of color name and chromaticity coordinate, the relationship of wavelength range of light and color name of monochromatic light, and the like are according to JIS Z 8110. When each component of a composition includes a plurality of substances, a content of the each component of the composition refers to the total amount of the plurality of substances that are included in the composition unless otherwise noted. The average particle diameter of the phosphors is a numerical value called "Fisher Sub Sieve Sizer's No." and measured by air permeability method.

Light Emitting Device

The light emitting device comprises: a light emitting element having an emission peak wavelength in a wavelength range of 430 nm to 470 nm, and a phosphor material containing: at least one type of phosphor selected from the group consisting of a first phosphor having composition represented by Formula (I) below and a second phosphor having composition represented by Formula (II) below, a third phosphor having composition represented by Formula (III) below, a fourth phosphor having composition represented by Formula (IV) below, and a fifth phosphor having composition represented by Formula (V) below.

$$(x-s)\text{MgO}\cdot(s/2)\text{Sc}_2\text{O}_3\cdot y\text{MgF}_2\cdot u\text{CaF}_2\cdot(1-t)\text{GeO}_2\cdot(t/2)\text{M}'_2\text{O}_3 \cdot z\text{Mn}^{4+} \quad (\text{I})$$

$$A_2[M_{1-p}F_6]\!:\!p\text{Mn}^{4+} \quad (\text{II})$$

$$\text{Lu}_3\text{Al}_5\text{O}_{12}\!:\!\text{Ce} \quad (\text{III})$$

$$(\text{Sr},\text{Ca})\text{AlSiN}_3\!:\!\text{Eu} \quad (\text{IV})$$

$$(\text{Ca},\text{Sr},\text{Ba})_8\text{MgSi}_4\text{O}_{16}(\text{F},\text{Cl},\text{Br})_2\!:\!\text{Eu} \quad (\text{V})$$

In the formulas, M' is at least one type selected from the group consisting of Al, Ga, and In; x, y, z, s, t, and u each satisfy $2 \leq x \leq 4$, $0 < y < 1.5$, $0 < z < 0.05$, $0 \leq s < 0.5$, $0 < t < 0.5$, and $0 \leq u < 1.5$; A is at least one type selected from the group consisting of K, Li, Na, Rb, Cs, and NH$_4$; M is at least one type of element selected from the group consisting of group 4 elements and group 14 elements; and p satisfies $0 < p < 0.2$.

The continuity of the emission spectrum of longer wavelength side can be significantly enhanced by combining a light emitting element that emits bluish purple to blue light, having an emission peak wavelength of 430 nm to 470 nm, with at least one of a first phosphor that emits deep red light or a second phosphor that emits red light, as well as a third phosphor that emits yellow light, a fourth phosphor that emits red light, and a fifth phosphor that emits green light. By this, the emission spectrum obtained from a color temperature of incandescent bulb becomes similar to that of the reference light source, and thus excellent color rendering properties can be achieved.

Regarding the color rendering index, the International Commission on Illumination (CIE) has published a guideline for color rendering index that should be provided with fluorescent lamps in 1986. According to the guideline, the preferable color rendering index average (hereinafter, referred to as "Ra") described considering the place where the lamps are used is 60 or higher but lower than 80 for factories where ordinary tasks are performed, 80 or higher but lower than 90 for houses, hotels, restaurants, shops, offices, schools, hospitals, factories where precise tasks are performed, and the like, and 90 or higher for places where clinical laboratory test requiring high color rendering properties is performed, museums, and the like.

The light emitting device of the present embodiment exhibits excellent color rendering properties. Specifically, for example, Ra of the light emitting device is 80 or higher, preferably 90 or higher, and more preferably 95 or higher. Note that the upper limit of Ra is 100. Furthermore, the special color rendering index is shown using indexes of R9 to R15, and R9 is red, R10 is yellow, R11 is green, R12 is blue, R13 is human complexion of Western people, R14 is moderate olive green, and R15 is human complexion of Japanese. In particular, the index of R9 attracts attention for lighting used in an environment where meat or the like is handled. For an environment for apparel or photographing, accuracy of color appearance of various colors is often required. A higher special color rendering index is thus preferred. For example, R9 to R15 of the light emitting device of the present embodiment are 50 or higher, preferably 60 or higher, more preferably 70 or higher, and even more preferably 80 or higher. Each of the upper limits of R9 to R15 is 100.

The light emitted by the light emitting device has mixed color formed from light of the light emitting element and luminescence emitted from at least one of the first phosphor or the second phosphor, from the third phosphor, from the fourth phosphor, and from the fifth phosphor. For example, in terms of the chromaticity coordinate stipulated by CIE 1931, the light can be light in the range of x=0.00 to 0.50 and y=0.00 to 0.50, or can be light in the range of x=0.33 to 0.50 and y=0.33 to 0.45.

The correlated color temperature of light emitted by the light emitting device can be set to, for example, 2000 K or higher, and 2500 K or higher. Furthermore, the correlated color temperature can be set to 3500 K or lower, or 3000 K or lower.

Examples of type of the light emitting device include pin through type, surface mount type, and the like. Typically, the pin through type refers to a type in which a lead (pin) of a light emitting device is penetrated through a through hole provided on a substrate to be mounted to fix the light emitting device. Furthermore, the surface mount type refers to a type in which a lead of a light emitting device is fixed on the surface of a substrate to be mounted.

A light emitting device 100 according to an embodiment of the present invention is described based on a drawing. FIG. 1 is a schematic cross-sectional view illustrating the light emitting device 100. The light emitting device 100 is an example of a surface mount type light emitting device.

The light emitting device 100 emits visible light having a wavelength in shorter wavelength side (e.g., in the range of 380 nm to 485 nm) and has a light emitting element 10 of a gallium nitride-based compound semiconductor having an emission peak wavelength in the range of 430 nm to 470 nm, and a molded article 40 on which the light emitting element 10 is mounted. The molded article 40 is an article in which the first lead 20 and the second lead 30 and the resin part 42, which contains a thermoplastic resin or thermosetting resin, are integrally molded. The molded article 40 is formed with a recessed portion having a bottom surface and side surfaces, and the light emitting element 10 is mounted on the bottom surface of the recessed portion. The light emitting element 10 has a pair of positive and negative electrodes, and the positive and negative electrodes of the pair are respectively electrically connected to the first lead 20 and the second lead 30 through wires 60. The light emitting element 10 is covered by a phosphor material 50. The phosphor material 50 contains, for example, a red phosphor 71 containing at least one type of a first phosphor or a second phosphor, a third phosphor 72, a fourth phosphor 73, and a fifth phosphor 74 as phosphors 70 that convert the wavelength of the light emitted from the light emitting element 10, and a resin.

The phosphor material 50 functions as a component to protect the light emitting element 10 from the external environment and also converts the wavelength of the light emitted from the light emitting element 10. In FIG. 1, the phosphors 70 are unevenly distributed in the phosphor material 50. By arranging the phosphors 70 close to the light emitting element 10, the wavelength of the light emitted from the light emitting element 10 can be efficiently converted, and the light emitting device having excellent luminous efficacy can be formed. Note that the arrangement of the phosphor material 50 containing the phosphors 70 and the light emitting element 10 is not particularly limited to the form in which these are arranged close to each other, and the light emitting element 10 and the phosphors 70 may be arranged to be spaced apart from one another in the phosphor material 50, taking the effect of heat on the phosphors 70 into consideration. Furthermore, by mixing the phosphors 70 substantially uniformly in the entire phosphor material 50, light with less color unevenness can be obtained.

Light Emitting Element

The emission peak wavelength of the light emitting element is in the range of 430 nm to 470 nm, and from the perspectives of luminous efficacy and color rendering properties, the emission peak wavelength is preferably in the range of 440 nm to 460 nm, and more preferably in the range of 445 nm to 455 nm. The light emitting device that emits mixed color light composed of light from the light emitting element and luminescence from the phosphor is formed using the light emitting element as an excitation light source.

The half width of the emission spectrum of the light emitting element can be, for example, 30 nm or less.

As the light emitting element, a semiconductor light emitting element, such as an LED, is preferably used. By using a semiconductor light emitting element as a light source, a light emitting device, by which output with high linearity can be obtained highly efficiently in response to input and which has excellent resistance to mechanical impact and is stable, can be obtained.

As the semiconductor light emitting element, for example, a semiconductor light emitting element that emits blue light or the like using a nitride-based semiconductor ($In_XAl_YGa_{1-X-Y}N$; X and Y satisfy $0 \leq X$, $0 \leq Y$, and $X+Y \leq 1$) can be used.

Phosphors

The light emitting device comprises at least one type of red phosphor selected from the group consisting of a first phosphor that emits deep red light and that has composition represented by Formula (I) below and a second phosphor that emits red light and that has composition represented by Formula (II) below, at least one type of a third phosphor that emits yellow light and that has composition represented by Formula (III) below, at least one type of a fourth phosphor that emits red light and that has composition represented by Formula (IV) below, and at least one type of a fifth phosphor that emits green light and that has composition represented by Formula (V) below, which absorb light emitted from the light emitting element. Each of the first phosphor, the second phosphor, the third phosphor, the fourth phosphor, and the fifth phosphor has a particular composition. By appropriately selecting the compositional ratio of the first phosphor, the second phosphor, the third phosphor, the fourth phosphor, and the fifth phosphor, characteristics such as luminous efficacy and color rendering properties of the light emitting device can be set to be within desired ranges.

First Phosphor

The first phosphor is a red light emitting phosphor that is activated with tetravalent manganese and that has composition represented by Formula (I) below. The first phosphor preferably has an emission peak wavelength at 650 nm or higher.

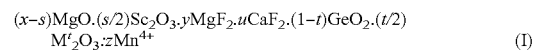
$(x-s)MgO.(s/2)Sc_2O_3.yMgF_2.uCaF_2.(1-t)GeO_2.(t/2)M^t_2O_3:zMn^{4+}$     (I)

However, in Formula (I), x, y, z, s, t, and u satisfy $2 \leq x \leq 4$, $0 < y < 1.5$, $0 < z < 0.05$, $0 \leq s < 0.5$, $0 < t < 0.5$, and $0 \leq u < 1.5$, and preferably satisfy $y+u < 1.5$. Furthermore, in Formula (I) above, $M^t$ is at least one type selected from the group consisting of Al, Ga, and In.

In Formula (I), s and t preferably satisfy $0.05 \leq s \leq 0.3$ and $0.05 \leq t < 0.3$, and by this, luminance can be further enhanced. Furthermore, Formula (I) is more preferably represented by

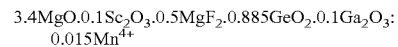
$3.4MgO.0.1Sc_2O_3.0.5MgF_2.0.885GeO_2.0.1Ga_2O_3: 0.015Mn^{4+}$

Hereinafter, the first phosphor having this particular composition is referred to as "MGF".

The half width in the emission spectrum of the first phosphor is, for example, 45 nm or less, and preferably 40 nm or less. Furthermore, in the emission spectrum of the first phosphor, the average light emission intensity is preferably 20% or less, and more preferably 10% or less, in the range of 600 nm to 620 nm when the maximum light emission intensity is taken to be 100%.

The average particle diameter of the first phosphor is, for example, 5 μm to 30 μm, and preferably 15 μm to 25 μm.

The light emitting device may contain one type of the first phosphor or a combination of two or more types of the first phosphors.

When the phosphor material contains the first phosphor, the content proportion of the content of the first phosphor to the total content of the phosphors is, for example, 1% by mass or more, 2% by mass or more, 4% by mass or more, 6% by mass or more, 9% by mass or more, 15% by mass or more, or 30% by mass or more, from the perspective of color rendering properties. Furthermore, the content proportion of the content of the first phosphor to the total content of the phosphors is, for example, 60% by mass or less, 55% by mass or less, 50% by mass or less, 48% by mass or less, 45% by mass or less, or 25% by mass or less, from the perspective of color rendering properties.

The content proportion of the content of the first phosphor to the total content of the phosphors may be selected depending on the target correlated color temperature of the light emitting device. For example, when the correlated color temperature is set to 2850 K to 3500 K and the phosphor material does not contain the second phosphor, the content proportion of the first phosphor is 2% by mass or more, 4% by mass or more, 6% by mass or more, or 15% by mass or more, but 55% by mass or less, 50% by mass or less, 48% by mass or less, 45% by mass or less, or 25% by mass or less, from the perspective of color rendering properties.

Furthermore, for example, when the correlated color temperature is set to 2000 K or higher but lower than 2850 K and does not contain the second phosphor, the content proportion of the first phosphor is 30% by mass or more, or 34% by mass or more, but 55% by mass or less, 50% by mass or less, or 48% by mass or less, from the perspective of color rendering properties.

Second Phosphor

The second phosphor is a red light emitting phosphor that is activated with tetravalent manganese and that has composition represented by Formula (II) below. The second phosphor preferably has an emission peak wavelength in the range of 610 nm to 650 nm.

$$A_2[M_{1-p}F_6]:pMn^{4+} \tag{II}$$

However, in Formula (II) above, A is at least one type selected from the group consisting of K, Li, Na, Rb, Cs, and NH$_4$; M is at least one type of element selected from the group consisting of group 4 elements and group 14 elements; and p is a number satisfying 0<p<0.2.

The half width in the emission spectrum of the second phosphor is preferably small and is, for example, 10 nm or less.

The average particle diameter of the second phosphor is, for example, 5 μm to 50 μm, and preferably 10 μm to 30 μm.

The light emitting device may contain one type of the second phosphor or a combination of two or more types of the second phosphors.

When the phosphor material contains the second phosphor, the content proportion of the content of the second phosphor to the total content of the phosphors is, for example, 1% by mass or more, 2% by mass or more, 3% by mass or more, 8% by mass or more, 15% by mass or more, or 25% by mass or more, from the perspective of color rendering properties. Furthermore, the content proportion of the content of the second phosphor to the total content of the phosphors is, for example, 50% by mass or less, 45% by mass or less, 38% by mass or less, 35% by mass or less, 29% by mass or less, 27% by mass or less, or 20% by mass or less, from the perspective of color rendering properties.

The content proportion of the content of the second phosphor to the total content of the phosphors may be selected depending on the target correlated color temperature of the light emitting device. For example, when the correlated color temperature is set to 2850 K to 3500 K and the phosphor material does not contain the first phosphor, the content proportion of the second phosphor is, for example, 2% by mass or more, 3% by mass or more, 8% by mass or more, or 15% by mass or more, but, for example, 50% by mass or less, 35% by mass or less, 27% by mass or less, 25% by mass or less, or 20% by mass or less, from the perspective of color rendering properties.

Furthermore, for example, when the correlated color temperature is set to 2000 K or higher but lower than 2850 K and does not contain the first phosphor, the content proportion of the second phosphor is, for example, 8% by mass or more, 15% by mass or more, or 25% by mass or more, but, for example, 45% by mass or less, 38% by mass or less, or 35% by mass or less, from the perspective of color rendering properties.

The phosphor material may contain at least one type of the first phosphor and at least one type of the second phosphor. When the phosphor material contains the first phosphor and the second phosphor, the content proportion of the total content of the first phosphor and the second phosphor to the total content of the phosphors is, for example, 15% by mass or more, 25% by mass or more, and 27% by mass or more, from the perspective of color rendering properties. Furthermore, the content proportion of the total content of the first phosphor and the second phosphor to the total content of the phosphors is, for example, 60% by mass or less, 45% by mass or less, and 43% by mass or less, from the perspective of color rendering properties.

Furthermore, the content ratio of the first phosphor to the second phosphor (first phosphor/second phosphor) in the phosphor material is, for example, 0.2 to 2.0, or 0.22 to 1.6.

The content proportion of the total content of the first phosphor and the second phosphor to the total content of the phosphors may be selected depending on the target correlated color temperature of the light emitting device. For example, when the correlated color temperature is set to 2850 K to 3500 K, the content proportion of the first phosphor and the second phosphor is, for example, 20% by mass or more, 25% by mass or more, or 28% by mass or more, but, for example, 50% by mass or less, 45% by mass or less, or 42% by mass or less, from the perspective of color rendering properties.

Furthermore, for example, when the correlated color temperature is set to 2000 K or higher but lower than 2850 K, the content proportion of the first phosphor and the second phosphor is, for example, 25% by mass or more, or 30% by mass or more, but, for example, 45% by mass or less, 40% by mass or less, or 38% by mass or less, from the perspective of color rendering properties.

Furthermore, for example, when the correlated color temperature is set to 2850 K to 3500 K, the content ratio of the first phosphor to the second phosphor (first phosphor/second phosphor) in the phosphor material is, for example, 0.22 to 2.0, or 0.4 to 1.6. Furthermore, for example, when the correlated color temperature is 2000 K or higher but lower than 2850 K, the content ratio is, for example, 0.20 to 1.6, or 0.22 to 0.8.

Third Phosphor

The third phosphor is a yellow light emitting phosphor that is activated with trivalent cerium and that has composition represented by Formula (III) below.

$$Lu_3Al_5O_{12}:Ce \tag{III}$$

The maximum excitation wavelength of the third phosphor is preferably 220 nm to 490 nm, and more preferably 430 nm to 470 nm. The emission peak wavelength of the third phosphor is preferably 480 nm to 630 nm, and more preferably 500 nm to 560 nm. The half width in the emission spectrum of the third phosphor is, for example, 53 nm to 73 nm, and preferably 58 nm to 68 nm.

The average particle diameter of the third phosphor is, for example, 5 μm to 30 μm, and preferably 20 μm to 25 μm.

The phosphor material may contain one type of the third phosphor or a combination of two or more types of the third phosphors.

The content proportion of the content of the third phosphor to the total content of the phosphors in the phosphor material is, for example, 30% by mass or more, or 38% by mass or more, from the perspective of color rendering properties. The content proportion of the content of the third phosphor to the total content of the phosphors is, for example, 90% by mass or less, or 80% by mass or less, from the perspective of color rendering properties.

Fourth Phosphor

The fourth phosphor is a red light emitting phosphor that is activated with divalent europium and that has composition represented by Formula (IV) below.

(Sr,Ca)AlSiN$_3$:Eu          (IV)

The fourth phosphor contains at least one type selected from the group consisting of Sr and Ca; however, the fourth phosphor preferably contains both Sr and Ca, and more preferably the Sr content among Sr and Ca is 0.8 mol % or more.

The emission peak wavelength of the fourth phosphor is preferably 620 nm to 650 nm, and more preferably 630 nm to 645 nm. The half width in the emission spectrum of the fourth phosphor is, for example, 80 nm to 100 nm, and preferably 85 nm to 95 nm.

The average particle diameter of the fourth phosphor is, for example, 5 μm to 15 μm, and preferably 8 μm to 12 μm.

The phosphor material may contain one type of the fourth phosphor or a combination of two or more types of the fourth phosphors.

The content proportion of the content of the fourth phosphor to the total content of the phosphors contained in the light emitting device is, for example, 1% by mass or more, 2% by mass or more, or 3% by mass or more, from the perspective of color rendering properties. Furthermore, the content proportion of the fourth phosphor is, for example, 20% by mass or less, 15% by mass or less, or 10% by mass or less, from the perspective of color rendering properties.

Fifth Phosphor

The fifth phosphor is a green light emitting phosphor that is activated with divalent europium and that has composition represented by Formula (V) below.

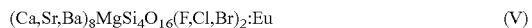

(Ca,Sr,Ba)$_8$MgSi$_4$O$_{16}$(F,Cl,Br)$_2$:Eu          (V)

The fifth phosphor contains at least one type selected from the group consisting of Ca, Sr, and Ba; however, the fifth phosphor preferably contains at least Ca, and more preferably the Ca content among Ca, Sr, and Ba is 90 mol % or more. The fifth phosphor contains at least one type selected from the group consisting of F, Cl, and Br; however, the fifth phosphor preferably contains at least Cl, and more preferably the Cl content among F, Cl, and Br is 90 mol % or more.

The emission peak wavelength of the fifth phosphor is preferably 510 nm to 540 nm, and more preferably 520 nm to 530 nm. The half width in the emission spectrum of the fifth phosphor is, for example, 50 nm to 75 nm, and preferably 58 nm to 68 nm.

The average particle diameter of the fifth phosphor is, for example, 5 μm to 20 μm, and preferably 10 μm to 15 μm.

The phosphor material may contain one type of the fifth phosphor or a combination of two or more types of the fifth phosphors.

The content proportion of the content of the fifth phosphor to the total content of the phosphors contained in the phosphor material is, for example, 1% by mass or more, 2% by mass or more, or 4% by mass or more, from the perspective of color rendering properties. Furthermore, the content proportion of the fifth phosphor is, for example, 20% by mass or less, 15% by mass or less, or 10% by mass or less, from the perspective of color rendering properties.

When the phosphor material contains the first phosphor, the content ratio of the first phosphor to the third phosphor (first phosphor/third phosphor) may be appropriately selected depending on the desired light emitting characteristics. The content ratio of the first phosphor to the third phosphor is 0.03 to 1.5, 0.1 to 1.4, or 0.2 to 1.25, for example, from the perspective of color rendering properties.

When the phosphor material contains the first phosphor and does not contain the second phosphor, the content ratio of the first phosphor to the third phosphor is 0.03 to 1.5, 0.2 to 1.4, or 0.2 to 1.25, for example, from the perspective of color rendering properties.

The content ratio of the first phosphor to the third phosphor may be selected depending on the target correlated color temperature of the light emitting device. For example, when the correlated color temperature is set to 2850 K to 3500 K, the content ratio of the first phosphor to the third phosphor is 0.03 to 1.5, 0.1 to 1.4, 0.2 to 1.25, or 0.2 to 1.0, from the perspective of color rendering properties.

Furthermore, for example, when the correlated color temperature is 2000 K or higher but lower than 2850 K, the content ratio of the first phosphor to the third phosphor is, for example, 0.6 to 1.5, 0.7 to 1.3, or 0.8 to 1.0, from the perspective of color rendering properties.

When the phosphor material contains the second phosphor, the content ratio of the second phosphor to the third phosphor (second phosphor/third phosphor) may be appropriately selected depending on the desired light emitting characteristics. The content ratio of the second phosphor to the third phosphor is 0.01 to 0.8, 0.05 to 0.65, or 0.1 to 0.5, for example, from the perspective of color rendering properties.

When the phosphor material contains the second phosphor and does not contain the first phosphor, the content ratio of the second phosphor to the third phosphor is 0.01 to 0.8, 0.03 to 0.65, 0.05 to 0.6, 0.1 to 0.5, or 0.1 to 0.35, for example, from the perspective of color rendering properties.

The content ratio of the second phosphor to the third phosphor may be selected depending on the target correlated color temperature of the light emitting device. For example, when the correlated color temperature is set to 2850 K to 3500 K, the content ratio of the second phosphor to the third phosphor is, for example, 0.03 to 1.0, 0.03 to 0.6, 0.1 to 0.5, or 0.1 to 0.4, from the perspective of color rendering properties.

Furthermore, for example, when the correlated color temperature is 2000 K or higher but lower than 2850 K, the content ratio of the second phosphor to the third phosphor is, for example, 0.1 to 1.0, 0.2 to 0.9, 0.2 to 0.8, or 0.3 to 0.6, from the perspective of color rendering properties.

When the phosphor material contains the first phosphor and the second phosphor, the content ratio of the total content of the first phosphor and the second phosphor to the content of the third phosphor ((first phosphor+second phosphor)/third phosphor) is 0.4 to 1.0, 0.45 to 0.9, or 0.55 to 0.75, for example, from the perspective of color rendering properties.

Furthermore, the content ratio of the first phosphor to the third phosphor is, for example, 0.1 to 0.6, or 0.12 to 0.51.

Furthermore, the content ratio of the second phosphor to the third phosphor is, for example, 0.3 to 0.6, or 0.32 to 0.49.

The content ratio of the total content of the first phosphor and the second phosphor to the content of the third phosphor may be selected depending on the target correlated color temperature of the light emitting device. For example, when the correlated color temperature is set to 2850 K to 3500 K, the content ratio of the total content of the first phosphor and the second phosphor to the content of the third phosphor is, for example, 0.4 to 1.0, 0.45 to 0.9, 0.5 to 0.8, or 0.55 to 0.75, from the perspective of color rendering properties.

Furthermore, for example, when the correlated color temperature is 2000 K or higher but lower than 2850 K, the content ratio of the second phosphor to the third phosphor is, for example, 0.4 to 1.0, 0.5 to 0.9, 0.5 to 0.8, or 0.5 to 0.75, from the perspective of color rendering properties.

In the emission spectrum in which the wavelength is plotted on the horizontal axis and the emission intensity is plotted on the vertical axis and which is obtained from the light emitting device having the phosphor material containing the first phosphor, the intensity ratio of the emission peak intensity of the first phosphor to the emission peak intensity of the light emitting element may be appropriately selected depending on the desired light emitting characteristics. The intensity ratio of the emission peak intensity of the first phosphor to the emission peak intensity of the light emitting element is 1 to 5, 1.3 to 4, 1.5 to 3.5, 1.6 to 2.65, or 2.75 to 3.5, when the emission peak intensity of the light emitting element is taken to be 1, for example, from the perspective of color rendering properties. In particular, the intensity ratio of 1.60 to 2.65 or 2.75 to 3.50 is preferable.

In the emission spectrum obtained from the light emitting device having the phosphor material containing the second phosphor, the intensity ratio of the emission peak intensity of the second phosphor to the emission peak intensity of the light emitting element may be appropriately selected depending on the desired light emitting characteristics. The intensity ratio of the emission peak intensity of the second phosphor to the emission peak intensity of the light emitting element is 1 to 11, 2 to 10, 3 to 9, 3 to 5, or 7 to 9, when the emission peak intensity of the light emitting element is taken to be 1, for example, from the perspective of color rendering properties. In particular, the intensity ratio of 3.0 to 5.0 or 7.0 to 9.0 is preferable.

In the emission spectrum obtained from the light emitting device having the phosphor material containing the first phosphor and the second phosphor, the intensity ratio of the emission peak intensity of the second phosphor to the emission peak intensity of the first phosphor may be appropriately selected depending on the desired light emitting characteristics. The intensity ratio of the emission peak intensity of the second phosphor to the emission peak intensity of the first phosphor is 1 to 4.5, 2.2 to 3.5, or 2.5 to 3.4, for example, from the perspective of color rendering properties.

Other Phosphor

The light emitting device may contain another phosphor except the first phosphor to the fifth phosphor, as necessary. Examples of such another phosphor include $(Sr,Ba,Ca)_{10}(PO_4)_6(Br,Cl)_2:Eu$, $(Y,Gd,Tb,Lu)_3(Al,Ga)_5O_{12}:Ce$, $Ca_3Sc_2Si_3O_{12}:Ce$, $CaSc_2O_4:Ce$, $(La,Y)_3Si_6N_{11}:Ce$, $(Ca,Sr,Ba)_3Si_6O_9N_4:Eu$, $(Ca,Sr,Ba)_3Si_6O_{12}N_2:Eu$, $(Ba,Sr,Ca)Si_2O_2N_2:Eu$, $(Ca,Sr,Ba)_2Si_5N_8:Eu$, $(Ca,Sr,Ba)S:Eu$, $(Ba,Sr,Ca)Ga_2S_4:Eu$, and the like. When the light emitting device contains such another phosphor, the content thereof is appropriately adjusted so that the light emitting characteristics of the present invention can be obtained.

For example, the phosphor can be produced as described below. Each of raw materials, such as single element, oxide, carbonate, nitride, chloride, fluoride, and sulfide, contained in composition of a phosphor is weighed to form a predetermined compositional ratio. Furthermore, additional ingredients, such as flux, are further added properly to the raw materials, and then wet or dry blended using a mixing machine. By this, it is possible to form particles having a uniform size by promoting a solid phase reaction. Furthermore, as the mixing machine, grinders such as vibration mill, roll mill, and jet mill can be used as well as ball mills that are ordinarily industrially used. The specific surface area can be made greater by grinding using a grinder. Furthermore, to adjust the specific surface area of powder to a particular range, classification can be performed by using wet separation equipment such as settling tank, hydrocyclone, and centrifugal separator and dry classifier such as cyclone and air separator that are ordinarily industrially used. The mixed raw materials described above are charged in a crucible formed from SiC, quartz, alumina, BN, or the like and fired in an inert gas atmosphere such as argon and nitrogen or reducing atmosphere containing hydrogen. The firing is performed at a predetermined temperature and time. The fired material is ground, dispersed, filtered, or the like to obtain the target phosphor powder. The solid-liquid separation can be performed by methods that are ordinarily and industrially used, such as filtration, vacuum filtration, pressure filtration, centrifugal separation, and decantation. The drying can be performed by devices that are ordinarily and industrially used, such as vacuum dryer, hot-air dryer, conical dryer, and rotary evaporator.

Phosphor Material

The light emitting device contains, for example, a phosphor material that contains the phosphors and a resin and that covers the light emitting element. Examples of the resin constituting the phosphor material include thermoplastic resins and thermosetting resins. Specific examples of the thermosetting resin include epoxy resins, silicone resins, modified silicone resins such as epoxy-modified silicone resins, and the like.

The phosphor material may contain another component in addition to the phosphors and the resin as necessary. Examples of such another component include fillers such as silica, barium titanate, titanium oxide, and aluminum oxide, photostabilizer, colorant, and the like. When the phosphor material contains such another component, the content thereof can be appropriately selected based on the purpose or the like. For example, when a filler is contained as the other component, the content thereof can be 0.01 to 20% by mass relative to the amount of the resin.

EXAMPLES

Examples of the present invention will be described below in detail.

Phosphors

Before production of the light emitting device, phosphors described below were prepared as phosphors used in examples and comparative examples.

As the first phosphor, a deep red light emitting phosphor having composition represented by Formula (I) below and having an emission peak wavelength around 658 nm (hereinafter, also referred to as "MGF") was prepared.

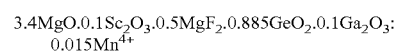

As the second phosphor, a fluoride phosphor having composition represented by Formula (II) below and having an emission peak wavelength around 630 nm (hereinafter, also referred to as "KSF") was prepared.

$$K_2SiF_6:Mn^{4+} \quad (II)$$

As the third phosphor, a rare earth aluminum garnet phosphor having composition represented by Formula (III) and having an emission peak wavelength around 520 nm (hereinafter, also referred to as "LAG") was prepared.

$$Lu_3Al_5O_{12}:Ce \quad (III)$$

As the fourth phosphor, a red light emitting nitride phosphor having composition represented by Formula (IV) and having an emission peak wavelength around 635 nm (hereinafter, also referred to as "SCASN") was prepared.

$$(Sr,Ca)AlSiN_3:Eu \quad (IV)$$

As the fifth phosphor, a green light emitting silicate phosphor having composition represented by Formula (Va) below and having an emission peak wavelength around 521 nm (hereinafter, also referred to as "chlorosilicate") was prepared.

$$Ca_8MgSi_4O_{16}Cl_2:Eu \quad (Va)$$

Note that the emission peak wavelength, half width, and the like of each of the phosphors can be adjusted by changing production condition or composition of the phosphors or the like.

As the light emitting element, gallium nitride-based semiconductor light emitting elements having an emission peak wavelength of 445 nm, 450 nm, or 455 nm were prepared.

Example 1

Production of Light Emitting Device

The MGF which was the first phosphor, the LAG which was the third phosphor, the SCASN which was the fourth phosphor, and the chlorosilicate which was the fifth phosphor were combined with a blue light emitting LED (light emitting element) which emitted light having the wavelength of 450 nm to produce a light emitting device.

Phosphors, which were compounded in a manner that the content proportion of the MGF relative to the total content of the phosphors was 3% by mass and the correlated color temperature was approximately 3000 K, were added to a silicone resin, mixed, dispersed, and then degassed to obtain a phosphor-containing resin composition. Thereafter, the phosphor-containing resin composition was injected and charged on the light emitting element and heated to cure the resin composition. By the process described above, the light emitting device was produced.

Examples 2 to 5

Light emitting devices were produced in the same manner as in Example 1 except for changing the amounts of phosphors so that the content proportions of the phosphors became the values shown in Table 1 below.

For the light emitting device obtained in Examples 1 to 5, the chromaticity coordinate, correlated color temperature (Tcp; K), color rendering index average (Ra), and special color rendering index (R1 to R15) of the emitted light were measured. Hereinafter, the color rendering index average and the special color rendering index may be together simply referred to as "color rendering index".

The emission spectrum of the light emitting device was measured using the Fluorescence Spectrophotometer F-4500, manufactured by Hitachi High-Technologies Corporation. Note that the same measurements were performed for the other examples and comparative examples described below.

The results except the color rendering indexes are shown in Table 1 below, and the results for color rendering index are shown in Table 2 below. Furthermore, Rt in Table 2 indicates the sum of the color rendering indexes of R9 to R15. Note that the phosphor content proportion (%) in the tables below is written on a mass basis.

TABLE 1

|  | Example 1 | Example 2 | Example 3 | Example 4 | Example 5 |
|---|---|---|---|---|---|
| Phosphor content proportion (%) First phosphor/all phosphors | 3.0 | 17.7 | 33.8 | 42.0 | 50.6 |
| Phosphor content ratio First phosphor/third phosphor | 0.04 | 0.27 | 0.63 | 0.90 | 1.27 |
| Intensity ratio of emission peaks First phosphor/light emitting element | 1.51 | 1.62 | 2.27 | 2.52 | 2.70 |
| Chromaticity coordinate x | 0.436 | 0.434 | 0.435 | 0.439 | 0.436 |
| Chromaticity coordinate y | 0.397 | 0.394 | 0.407 | 0.402 | 0.395 |
| Correlated color temperature (K) | 2944 | 2947 | 3040 | 2926 | 2919 |

TABLE 2

|  | Example 1 | Example 2 | Example 3 | Example 4 | Example 5 |
|---|---|---|---|---|---|
| Ra | 95.5 | 96.5 | 98.1 | 95.6 | 92.4 |
| R1 | 97.7 | 98.8 | 98.6 | 94.8 | 91.0 |
| R2 | 98.3 | 98.6 | 99.2 | 98.2 | 95.9 |
| R3 | 97.9 | 97.7 | 95.4 | 95.7 | 95.3 |
| R4 | 96.1 | 95.7 | 95.9 | 92.1 | 88.8 |
| R5 | 98.0 | 98.6 | 98.8 | 94.6 | 90.7 |
| R6 | 96.6 | 95.9 | 98.4 | 95.9 | 93.6 |
| R7 | 92.8 | 94.6 | 99.0 | 98.0 | 95.8 |
| R8 | 86.2 | 91.6 | 99.3 | 95.3 | 87.8 |
| R9 | 69.1 | 81.6 | 96.1 | 91.5 | 74.3 |
| R10 | 95.9 | 97.8 | 97.5 | 96.8 | 92.0 |
| R11 | 94.7 | 92.7 | 92.4 | 87.4 | 83.6 |
| R12 | 91.5 | 92.0 | 89.1 | 92.0 | 89.3 |
| R13 | 98.2 | 98.6 | 99.0 | 95.2 | 91.6 |
| R14 | 98.1 | 97.9 | 96.6 | 96.6 | 96.2 |
| R15 | 93.8 | 97.3 | 99.1 | 95.7 | 89.9 |
| Rt | 641.3 | 658.0 | 669.8 | 655.2 | 617.1 |

From Tables 1 and 2, Examples 1 to 5 enhanced Ra and R9 and achieved high color rendering indexes of 80 or higher for R10 to R15 by adding the MGF which was the first phosphor, compared to those of Comparative Example 2. That is, the light emitting characteristics can be optionally adjusted by adjusting the added amount of the MGF, which was the first phosphor, and it is easy to obtain desired characteristics.

From the perspective of the color rendering index obtained from the light emitting devices, Examples 2, 3, and 4, in which the content proportion of the first phosphor (MGF) relative to the total content of the phosphors was 15% by mass to 48% by mass and the content ratio of the first phosphor to the third phosphor was in the range of 0.2 to 1.25, exhibited the Rt values of 655 or higher, and thus it was clear that Examples 2, 3, and 4 had especially excellent color rendering properties.

Figure 2:
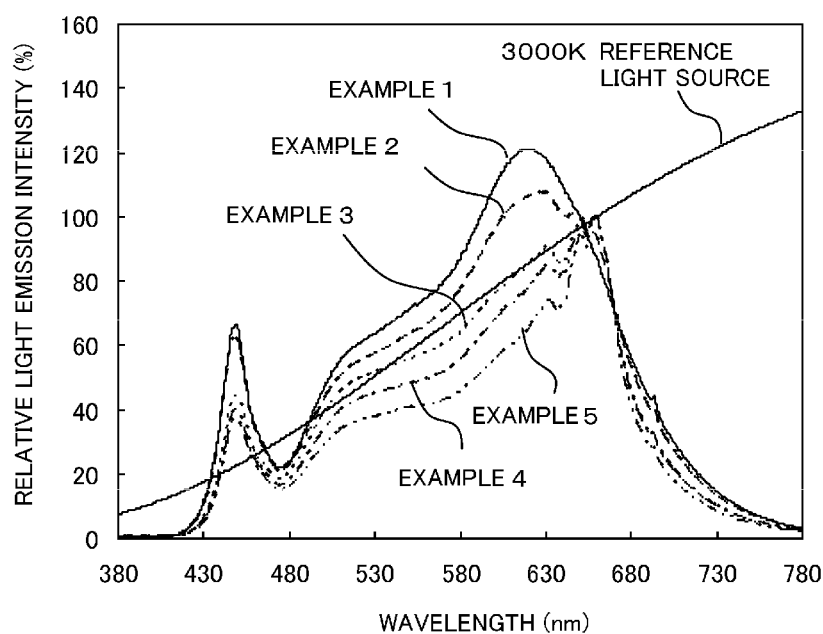
FIG. 2 is a diagram showing an example of emission spectra plotting the relative light emission intensity against the wavelength of light emitting devices according to Examples 1 to 5.

FIG. 2 is a diagram comparing the emission spectra of the light emitting devices according to Examples 1 to 5 after normalizing each of the spectra. The emission spectra of FIG. 2 show relative light emission intensity versus the wavelength. As shown in Tables 1 and 2, Examples 2, 3, and 4, in which the intensity ratio of the emission peak of the first phosphor to the emission peak of the light emitting element in the emission spectrum was 1.60 to 2.65, exhibited the Rt values of 655 or higher, and thus it was clear that Examples 2, 3, and 4 had especially excellent color rendering properties.

Examples 6 to 9

Light emitting devices were produced in the same manner as in Example 1 except for using the second phosphor in place of the first phosphor and changing the amounts of phosphors so that the content proportions of the phosphors became the values shown in Table 3 below.

The evaluation results except the color rendering indexes are shown in Table 3 below, and the results for color rendering index are shown in Table 4 below.

TABLE 3

|  | Example 6 | Example 7 | Example 8 | Example 9 |
|---|---|---|---|---|
| Phosphor content proportion (%) Second phosphor/all phosphors | 3.2 | 9.7 | 19.3 | 30.0 |
| Phosphor content ratio Second phosphor/third phosphor | 0.04 | 0.13 | 0.29 | 0.53 |
| Intensity ratio of emission peaks Second phosphor/light emitting element | 2.22 | 3.06 | 4.08 | 5.16 |
| Chromaticity coordinate x | 0.440 | 0.434 | 0.442 | 0.442 |
| Chromaticity coordinate y | 0.403 | 0.404 | 0.401 | 0.391 |
| Correlated color temperature (K) | 2919 | 3029 | 2873 | 2794 |

TABLE 4

|  | Example 6 | Example 7 | Example 8 | Example 9 |
|---|---|---|---|---|
| Ra | 94.8 | 96.7 | 96.0 | 91.5 |
| R1 | 96.1 | 98.6 | 96.9 | 88.8 |
| R2 | 97.5 | 99.1 | 98.6 | 94.1 |
| R3 | 97.9 | 95.6 | 96.5 | 95.9 |
| R4 | 96.2 | 94.6 | 93.4 | 85.6 |
| R5 | 96.4 | 98.5 | 96.4 | 88.1 |
| R6 | 97.0 | 97.4 | 94.9 | 87.7 |
| R7 | 92.8 | 96.7 | 96.2 | 97.0 |
| R8 | 84.5 | 93.8 | 94.6 | 94.8 |
| R9 | 64.3 | 83.0 | 86.4 | 90.7 |
| R10 | 93.7 | 96.8 | 98.6 | 89.8 |
| R11 | 96.2 | 90.4 | 88.7 | 78.5 |
| R12 | 89.8 | 91.8 | 94.5 | 86.7 |
| R13 | 96.6 | 98.9 | 97.1 | 89.3 |
| R14 | 98.0 | 96.3 | 96.6 | 95.8 |
| R15 | 91.7 | 97.1 | 98.8 | 90.9 |
| Rt | 630.4 | 654.3 | 660.8 | 621.9 |

From Tables 3 and 4, Examples 6 to 9 enhanced Ra and R9 and achieved high color rendering indexes of 80 or higher for R10 to R15 by adding the KSF which was the second phosphor, compared to those of Comparative Example 2. That is, the light emitting characteristics can be optionally adjusted by adjusting the added amount of the KSF, which was the second phosphor, and it is easy to obtain desired characteristics.

From the perspective of the color rendering properties obtained from the light emitting devices, Examples 7 and 8, in which the content proportion of the second phosphor (KSF) relative to the total content of the phosphors was 8% by mass to 29% by mass and the content ratio of the second phosphor to the third phosphor was 0.1 to 0.5, exhibited the Rt values of 650 or higher, and thus it was clear that Examples 7 and 8 had especially excellent color rendering properties.

Figure 3:
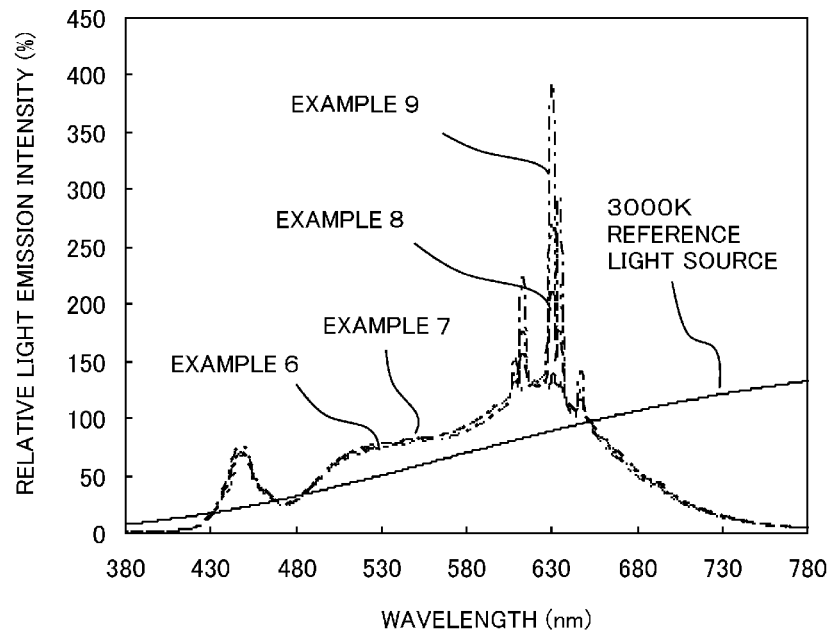
FIG. 3 is a diagram showing an example of emission spectra plotting the relative light emission intensity against the wavelength of light emitting devices according to Examples 6 to 9.
Figure 4:
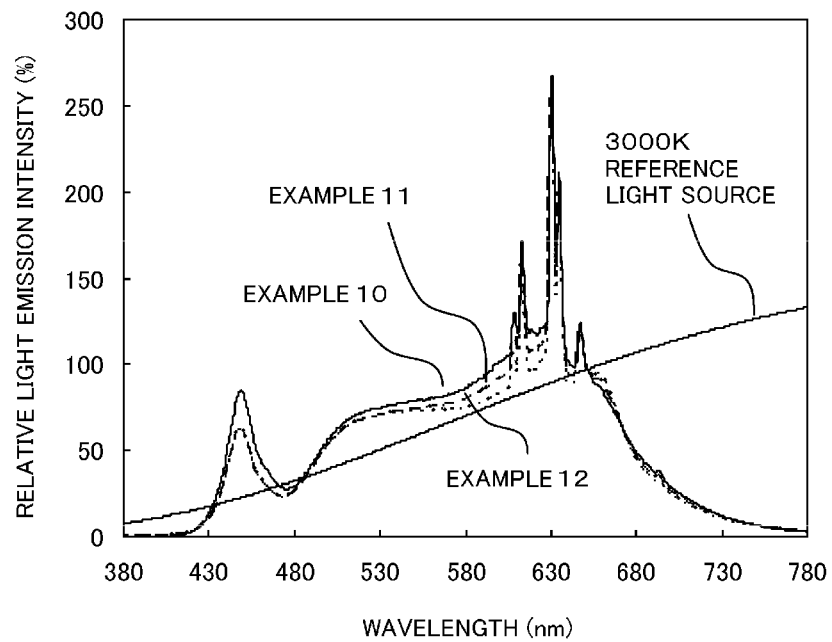
FIG. 4 is a diagram showing an example of emission spectra plotting the relative light emission intensity against the wavelength of light emitting devices according to Examples 10 to 12.

FIG. 3 is a diagram comparing the emission spectra of the light emitting devices according to Examples 6 to 9 after normalizing each of the spectra. The emission spectra of FIG. 3 show relative light emission intensity versus the wavelength. As shown in Tables 3 and 4, Examples 7 and 8, in which the intensity ratio of the emission peak of the second phosphor to the emission peak of the light emitting element in the emission spectrum was 3.0 to 5.0, exhibited the Rt values of 650 or higher, and thus it was clear that Examples 7 and 8 had especially excellent color rendering properties.

Examples 10 to 12

Light emitting devices were produced in the same manner as in Example 1 except for using a combination of the first phosphor and the second phosphor and changing the amounts of phosphors so that the content proportions of the phosphors became the values shown in Table 5 below.

The results except the color rendering indexes are shown in Table 5 below, and the results for color rendering index are shown in Table 6 below.

TABLE 5

|  | Example 10 | Example 11 | Example 12 |
|---|---|---|---|
| Phosphor content proportion (%) First phosphor/all phosphors | 9.5 | 17.8 | 24.5 |
| Phosphor content proportion (%) Second phosphor/all phosphors | 19.0 | 17.8 | 16.4 |
| Phosphor content ratio First phosphor/third phosphor | 0.16 | 0.34 | 0.51 |
| Phosphor content ratio Second phosphor/third phosphor | 0.33 | 0.34 | 0.34 |
| Intensity ratio of emission peaks First phosphor/light emitting element | 1.22 | 1.67 | 1.71 |
| Intensity ratio of emission peaks Second phosphor/light emitting element | 3.16 | 4.12 | 3.84 |
| Intensity ratio of emission peaks Second phosphor/first phosphor | 2.68 | 2.54 | 2.31 |
| Chromaticity coordinate x | 0.423 | 0.433 | 0.425 |
| Chromaticity coordinate y | 0.388 | 0.404 | 0.406 |
| Correlated color temperature (K) | 3107 | 3046 | 3205 |

TABLE 6

|  | Example 10 | Example 11 | Example 12 |
|---|---|---|---|
| Ra | 94.2 | 94.9 | 94.2 |
| R1 | 92.6 | 93.9 | 93.5 |
| R2 | 96.8 | 98.8 | 99.3 |

TABLE 6-continued

|     | Example 10 | Example 11 | Example 12 |
|-----|------------|------------|------------|
| R3  | 95.2       | 93.5       | 92.0       |
| R4  | 89.7       | 90.4       | 89.9       |
| R5  | 92.7       | 94.2       | 94.4       |
| R6  | 93.0       | 96.1       | 97.9       |
| R7  | 97.4       | 97.4       | 95.3       |
| R8  | 96.4       | 95.3       | 91.3       |
| R9  | 94.1       | 94.3       | 86.1       |
| R10 | 95.4       | 99.0       | 98.8       |
| R11 | 84.6       | 85.6       | 85.6       |
| R12 | 92.2       | 93.3       | 91.2       |
| R13 | 93.3       | 95.0       | 95.1       |
| R14 | 95.9       | 95.1       | 94.3       |
| R15 | 93.8       | 95.7       | 94.5       |
| Rt  | 649.2      | 658.0      | 645.6      |

From Tables 5 and 6, Examples 10 to 12 enhanced Ra and R9 and achieved high color rendering indexes of 80 or higher for R10 to R15 by adding the MGF which was the first phosphor and the KSF which was the second phosphor, compared to those of Comparative Example 2. That is, the light emitting characteristics can be optionally adjusted by adjusting the added amount of the MGF, which was the first phosphor, and the KSF, which was the second phosphor, and it is easy to obtain desired characteristics.

From the perspective of the color rendering properties obtained from the light emitting devices, Examples 10, 11, and 12, in which the content proportion of the first phosphor (MGF) relative to the total content of the phosphors was 6% by mass to 25% by mass and the content proportion of the second phosphor (KSF) to the total content of the phosphors was 15% by mass to 27% by mass, exhibited the Rt values of 645 or higher, and thus it was clear that Examples 10, 11, and 12 had especially excellent color rendering properties. Note that, in the Examples 10, 11, and 12, the content ratio of the first phosphor to the third phosphor is 0.12 to 0.51, and the content ratio of the second phosphor to the third phosphor is 0.32 to 0.49.

Figure 5:
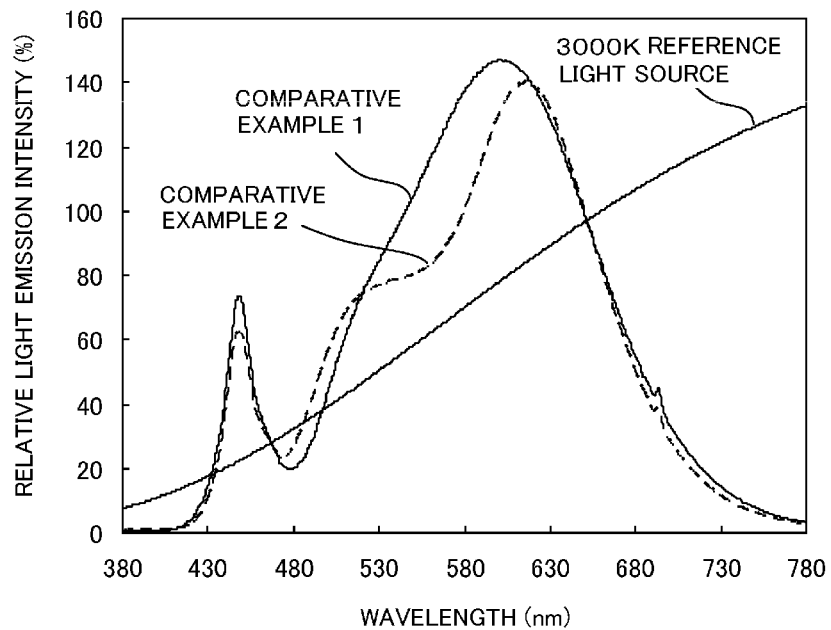
FIG. 5 is a diagram showing an example of emission spectra plotting the relative light emission intensity against the wavelength of light emitting devices according to Comparative Examples 1 and 2.

FIG. 5 is a diagram comparing the emission spectra of the light emitting devices according to Examples 10 to 12 after normalizing each of the spectra. The emission spectra of FIG. 5 show relative light emission intensity versus the wavelength. As shown in Tables 5 and 6, Examples 10 to 12, in which the intensity ratio of the emission peak of the second phosphor to the emission peak of the first phosphor in the emission spectrum was 2.2 to 3.5, exhibited the Rt values of 645 or higher, and thus it was clear that Examples 10 to 12 had especially excellent color rendering properties.

Comparative Example 1

A light emitting device was produced in the same manner as in Example 1 except for using no first phosphor, no second phosphor, no third phosphor, and no fifth phosphor, but using a combination of a rare earth aluminum garnet phosphor having an emission peak wavelength of approximately 555 nm (hereinafter, also referred to as "YAG") and the SCASN which was the fourth phosphor as the phosphors.

Comparative Example 2

A light emitting device was produced in the same manner as in Example 1 except for using no first phosphor and no second phosphor but using a combination of the LAG, the SCASN, and the chlorosilicate as the phosphors.

For the light emitting device obtained by Comparative Examples 1 and 2, the results except the color rendering indexes are shown in Table 7 below, and the results for color rendering index are shown in Table 8 below.

TABLE 7

|                                 |   | Comparative Example 1 | Comparative Example 2 |
|---------------------------------|---|-----------------------|-----------------------|
| Chromaticity coordinate         | x | 0.441                 | 0.442                 |
|                                 | y | 0.419                 | 0.411                 |
| Correlated color temperature (K) |   | 3040                  | 2959                  |

TABLE 8

|     | Comparative Example 1 | Comparative Example 2 |
|-----|-----------------------|-----------------------|
| Ra  | 80.3                  | 97.8                  |
| R1  | 77.7                  | 96.0                  |
| R2  | 85.4                  | 97.5                  |
| R3  | 93.0                  | 98.9                  |
| R4  | 79.7                  | 98.0                  |
| R5  | 76.6                  | 96.5                  |
| R6  | 80.0                  | 97.8                  |
| R7  | 87.1                  | 92.4                  |
| R8  | 63.1                  | 81.1                  |
| R9  | 10.1                  | 55.1                  |
| R10 | 66.2                  | 94.0                  |
| R11 | 76.7                  | 95.7                  |
| R12 | 57.2                  | 89.0                  |
| R13 | 78.6                  | 96.8                  |
| R14 | 95.7                  | 98.4                  |
| R15 | 71.5                  | 89.2                  |
| Rt  | 456.0                 | 618.2                 |

Figure 6:
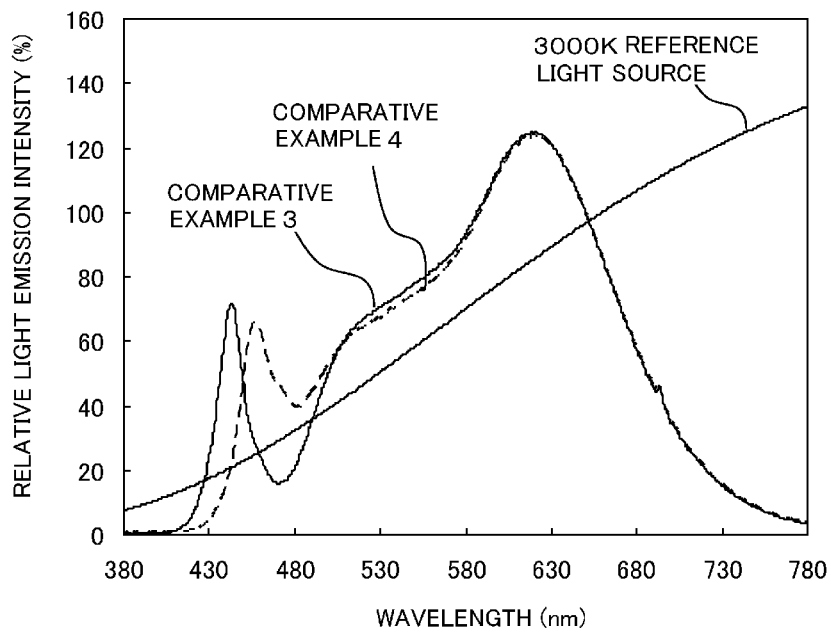
FIG. 6 is a diagram showing an example of emission spectra plotting the relative light emission intensity against the wavelength of light emitting devices according to Comparative Examples 3 and 4.

As in Tables 5 and 6, Ra of Comparative Example 1 was approximately 80 and R9 was approximately 10. Comparative Example 2 exhibited Ra of approximately 98, which was high, due to the wider spectrum obtained by using the LAG having a shorter emission peak wavelength than that of the YAG and due to complementary color effect obtained by using the green light emitting chlorosilicate; however, although R9 thereof was enhanced compared to that of Comparative Example 1, R9 was approximately 55 and still had room for improvement, and Comparative Example 2 cannot achieve high color rendering index when the criteria of high color rendering index is taken to be Ra≥90 and R9 to R15≥80. FIG. 6 is a diagram comparing the emission spectra of the light emitting devices according to Comparative Examples 1 and 2 after normalizing each of the spectra. The emission spectra of FIG. 6 show relative light emission intensity versus the wavelength.

Comparative Example 3

A light emitting device was produced in the same manner as in Example 1 except for using no first phosphor and no second phosphor but using a combination of the LAG, the SCASN, and the chlorosilicate as the phosphors, and changed the light emitting element to a light emitting element having an emission peak wavelength of 445 nm.

Comparative Example 4

A light emitting device was produced in the same manner as in Example 1 except for using no first phosphor and no second phosphor but using a combination of the LAG, the SCASN, and the chlorosilicate as the phosphors, and changed the light emitting element to a light emitting element having an emission peak wavelength of 455 nm.

For the light emitting device obtained by Comparative Examples 3 and 4, the results except the color rendering indexes are shown in Table 9 below, and the results for color rendering index are shown in Table 10 below.

TABLE 9

|  |  | Comparative Example 3 | Comparative Example 4 |
|---|---|---|---|
| Chromaticity coordinate | x | 0.434 | 0.432 |
|  | y | 0.403 | 0.402 |
| Correlated color temperature (K) |  | 3016 | 3051 |

TABLE 10

|  | Comparative Example 3 | Comparative Example 4 |
|---|---|---|
| Ra | 93.2 | 94.8 |
| R1 | 95.0 | 98.4 |
| R2 | 95.1 | 98.0 |
| R3 | 94.8 | 96.5 |
| R4 | 93.8 | 96.1 |
| R5 | 94.6 | 97.3 |
| R6 | 95.2 | 93.9 |
| R7 | 92.5 | 91.4 |
| R8 | 84.5 | 86.5 |
| R9 | 62.5 | 72.7 |
| R10 | 88.6 | 96.7 |
| R11 | 94.2 | 98.3 |
| R12 | 87.9 | 82.8 |
| R13 | 94.8 | 99.1 |
| R14 | 96.4 | 98.8 |
| R15 | 90.2 | 94.5 |
| Rt | 614.6 | 642.8 |

As is clear from Tables 9 and 10, the emission spectrum of the light emitting device was significantly affected by the emission peak wavelength of the light emitting element. Comparative Example 3 exhibited lower color rendering indexes such as Ra and R9 than those of Comparative Example 4. This is because the spectrum component in the color rendering index calculation becomes smaller as the wavelength of the light emitting element becomes shorter; however, since the light emission intensity of the light emitting element becomes more intense as a result of the trade-off, the luminous efficacy is enhanced. That is, it is confirmed that a shorter emission peak wavelength of the light emitting element tends to enhance the luminous efficacy more, and a longer emission peak wavelength tends to enhance the color rendering index more. Because of this and because the luminous efficacy and the color rendering index are in a trade-off relationship, it is conceived that a light emitting device with high color rendering indexes can be obtained when the emission peak wavelength of the light emitting element is in the range of 40 nm to 460 nm.

Figure 7:
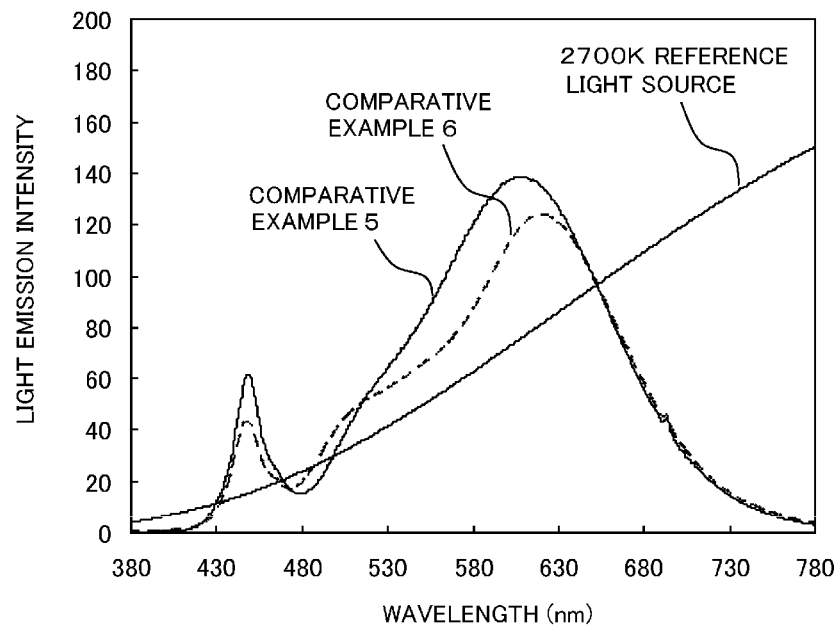
FIG. 7 is a diagram showing an example of emission spectra plotting the relative light emission intensity against the wavelength of light emitting devices according to Comparative Examples 5 and 6.

FIG. 7 is a diagram comparing the emission spectra of the light emitting devices according to Comparative Examples 3 and 4 after normalizing each of the spectra. The emission spectra of FIG. 7 show relative light emission intensity versus the wavelength.

Comparative Example 5

A light emitting device was produced in the same manner as in Example 1 except for using no first phosphor, no second phosphor, no third phosphor, and no fifth phosphor, but using a combination of the YAG and the SCASN which was the fourth phosphor as the phosphors, and adjusting the correlated color temperature to be 2700 K.

Comparative Example 6

A light emitting device was produced in the same manner as in Example 1 except for using no first phosphor and no second phosphor, but using a combination of the LAG, the SCASN, and the chlorosilicate as the phosphors, and adjusting the correlated color temperature to be 2700 K.

For the light emitting device obtained by Comparative Examples 5 and 6, the results except the color rendering indexes are shown in Table 11 below, and the results for color rendering index are shown in Table 12 below.

TABLE 11

|  |  | Comparative Example 5 | Comparative Example 6 |
|---|---|---|---|
| Chromaticity coordinate | x | 0.459 | 0.463 |
|  | y | 0.411 | 0.411 |
| Correlated color temperature (K) |  | 2704 | 2646 |

TABLE 12

|  | Comparative Example 5 | Comparative Example 6 |
|---|---|---|
| Ra | 81.4 | 93.8 |
| R1 | 79.4 | 94.6 |
| R2 | 88.1 | 97.4 |
| R3 | 95.7 | 99.1 |
| R4 | 78.8 | 95.7 |
| R5 | 78.3 | 95.2 |
| R6 | 84.5 | 97.5 |
| R7 | 84.3 | 91.0 |
| R8 | 61.8 | 80.2 |
| R9 | 15.1 | 56.8 |
| R10 | 72.5 | 94.0 |
| R11 | 76.2 | 97.5 |
| R12 | 65.3 | 92.2 |
| R13 | 80.6 | 95.5 |
| R14 | 97.3 | 98.9 |
| R15 | 73.6 | 89.0 |
| Rt | 480.6 | 623.8 |

As is clear from Tables 11 and 12, Comparative Examples 5 and 6 exhibited the same tendency as those of Comparative Examples 1 and 2.

Figure 8:
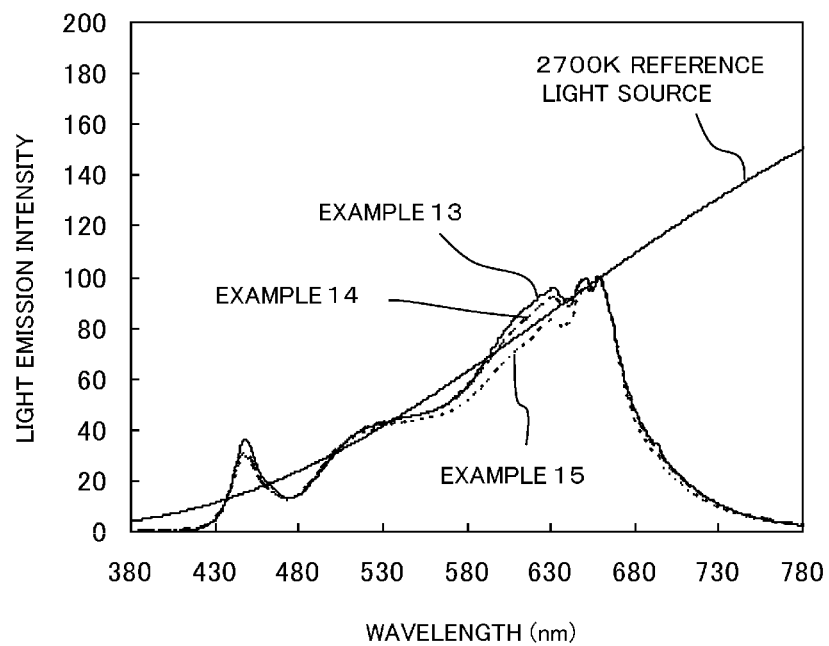
FIG. 8 is a diagram showing an example of emission spectra plotting the relative light emission intensity against the wavelength of light emitting devices according to Examples 13 to 15.

FIG. 8 is a diagram comparing the emission spectra of the light emitting devices according to Comparative Examples 5 and 6 after normalizing each of the spectra. The emission spectra of FIG. 8 show relative light emission intensity versus the wavelength.

Examples 13 to 15

Light emitting devices were produced in the same manner as in Example 1 except for changing the amounts of phosphors so that the content proportions of the phosphors became the values shown in Table 13 below, and adjusting the correlated color temperature to be 2700 K.

For the light emitting device obtained by Examples 13 to 15, the results except the color rendering indexes are shown in Table 13 below, and the results for color rendering index are shown in Table 14 below.

TABLE 13

|  | Example 13 | Example 14 | Example 15 |
|---|---|---|---|
| Phosphor content proportion (%) First phosphor/all phosphors | 35.4 | 41.7 | 47.2 |
| Phosphor content ratio First phosphor/third phosphor | 0.75 | 0.97 | 1.22 |
| Intensity ratio of emission peaks First phosphor/light emitting element | 2.77 | 3.28 | 3.48 |
| Chromaticity coordinate x | 0.461 | 0.463 | 0.457 |
| Chromaticity coordinate y | 0.402 | 0.409 | 0.411 |
| Correlated color temperature (K) | 2609 | 2635 | 2739 |

TABLE 14

|  | Example 13 | Example 14 | Example 15 |
|---|---|---|---|
| Ra | 95.3 | 96.1 | 94.9 |
| R1 | 95.1 | 95.5 | 94.1 |
| R2 | 97.1 | 98.2 | 98.3 |
| R3 | 97.7 | 96.6 | 94.8 |
| R4 | 91.8 | 92.0 | 90.5 |
| R5 | 94.0 | 94.6 | 93.7 |
| R6 | 92.6 | 94.6 | 95.7 |
| R7 | 96.7 | 98.5 | 97.7 |
| R8 | 97.5 | 99.1 | 94.9 |
| R9 | 94.8 | 97.1 | 92.1 |
| R10 | 94.6 | 96.8 | 97.0 |
| R11 | 85.6 | 86.0 | 85.0 |
| R12 | 91.2 | 94.0 | 94.1 |
| R13 | 94.8 | 95.5 | 94.6 |
| R14 | 97.5 | 96.8 | 95.9 |
| R15 | 97.9 | 98.3 | 96.0 |
| Rt | 656.4 | 664.5 | 654.7 |

From Tables 13 and 14, Examples 13 to 15 enhanced Ra and R9 and achieved high color rendering indexes of 80 or higher for R10 to R15 by adding the MGF which was the first phosphor, compared to those of Comparative Example 6. That is, the light emitting characteristics can be optionally adjusted by adjusting the added amount of the MGF, which was the first phosphor, and it is easy to obtain desired characteristics.

From the perspective of the color rendering index obtained from the light emitting devices, Examples 13, 14, and 15, in which the content proportion of the first phosphor (MGF) relative to the total content of the phosphors was 30% by mass to 50% by mass and the content ratio of the first phosphor to the third phosphor was in the range of 0.2 to 1.25, exhibited the Rt values of 650 or higher, and thus it was clear that Examples 13, 14, and 15 had especially excellent color rendering properties.

Figure 9:
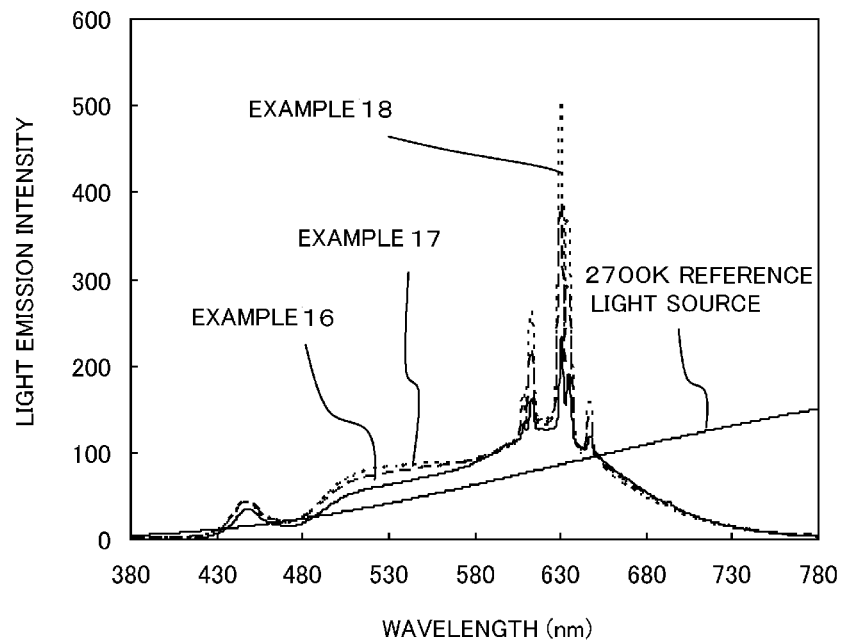
FIG. 9 is a diagram showing an example of emission spectra plotting the relative light emission intensity against the wavelength of light emitting devices according to Examples 16 to 18.

FIG. 9 is a diagram comparing the emission spectra of the light emitting devices according to Examples 13 to 15 after normalizing each of the spectra. The emission spectra of FIG. 9 show relative light emission intensity versus the wavelength. As shown in Tables 13 and 14, Examples 13, 14, and 15, in which the intensity ratio of the emission peak of the first phosphor to the emission peak of the light emitting element in the emission spectrum was 2.75 to 3.50, exhibited the Rt values of 650 or higher, and thus it was clear that Examples 13, 14, and 15 had especially excellent color rendering properties.

Examples 16 to 18

Light emitting devices were produced in the same manner as in Example 1 except for using the second phosphor in place of the first phosphor and changing the amounts of phosphors so that the content proportions of the phosphors became the values shown in Table 15 below, and adjusting the correlated color temperature to be 2700 K.

For the light emitting device obtained by Examples 16 to 18, the results except the color rendering indexes are shown in Table 15 below, and the results for color rendering index are shown in Table 16 below.

TABLE 15

|  | Example 16 | Example 17 | Example 18 |
|---|---|---|---|
| Phosphor content proportion (%) Second phosphor/all phosphors | 15.4 | 28.2 | 37.0 |
| Phosphor content ratio Second phosphor/third phosphor | 0.22 | 0.47 | 0.71 |
| Intensity ratio of emission peaks Second phosphor/light emitting element | 6.70 | 8.89 | 12.20 |
| Chromaticity coordinate x | 0.471 | 0.463 | 0.465 |
| Chromaticity coordinate y | 0.422 | 0.420 | 0.422 |
| Correlated color temperature (K) | 2631 | 2717 | 2703 |

TABLE 16

|  | Example 16 | Example 17 | Example 18 |
|---|---|---|---|
| Ra | 96.6 | 95.3 | 91.2 |
| R1 | 98.6 | 93.9 | 89.0 |
| R2 | 98.0 | 98.8 | 96.8 |
| R3 | 96.5 | 93.7 | 91.7 |
| R4 | 98.0 | 89.8 | 84.3 |
| R5 | 98.7 | 94.0 | 89.3 |
| R6 | 98.4 | 94.4 | 91.2 |
| R7 | 95.7 | 99.2 | 96.0 |
| R8 | 88.5 | 98.8 | 91.7 |
| R9 | 71.2 | 95.0 | 89.6 |
| R10 | 94.6 | 98.5 | 95.1 |
| R11 | 93.7 | 84.0 | 77.3 |
| R12 | 93.3 | 98.2 | 95.1 |
| R13 | 98.5 | 95.0 | 90.7 |
| R14 | 96.8 | 94.9 | 93.5 |
| R15 | 93.0 | 98.1 | 93.1 |
| Rt | 641.1 | 663.8 | 634.3 |

From Tables 15 and 16, Examples 16 to 18 enhanced Ra and R9 and achieved high color rendering indexes of 80 or higher for R10 to R15 by adding the KSF which was the second phosphor, compared to those of Comparative Example 6. That is, the light emitting characteristics can be optionally adjusted by adjusting the added weight of the KSF, which was the second phosphor, and it is easy to obtain desired characteristics.

From the perspective of the color rendering index obtained from the light emitting devices, Examples 16 and 17, in which the content proportion of the second phosphor (KSF) relative to the total content of the phosphors was 8% by mass to 29% by mass and the content ratio of the second phosphor to the third phosphor was 0.1 to 0.5, exhibited the Rt values of 640 or higher, and thus it was clear that Examples 16 and 17 had excellent color rendering properties.

Figure 10:
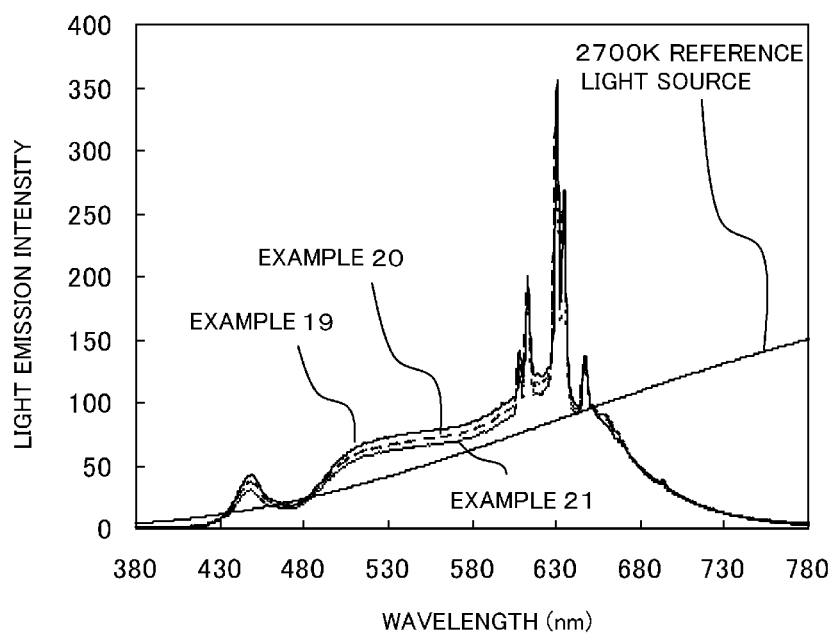
FIG. 10 is a diagram showing an example of emission spectra plotting the relative light emission intensity against the wavelength of light emitting devices according to Examples 19 to 21.

FIG. 10 is a diagram comparing the emission spectra of the light emitting devices according to Examples 16 to 18 after normalizing each of the spectra. The emission spectra of FIG. 10 show relative light emission intensity versus the wavelength. As shown in Tables 15 and 16, Example 17, in which the intensity ratio of the emission peak of the second phosphor to the emission peak of the light emitting element in the emission spectrum was 7.0 to 9.0, exhibited the Rt values of 660 or higher, and thus it was clear that Example 17 had especially excellent color rendering properties.

Examples 19 to 21

Light emitting devices were produced in the same manner as in Example 1 except for using a combination of the first phosphor and the second phosphor, changing the amounts of phosphors so that the content proportions of the phosphors became the values shown in Table 17 below, and adjusting the correlated color temperature to be 2700 K.

The results except the color rendering indexes are shown in Table 17 below, and the results for color rendering index are shown in Table 18 below.

TABLE 17

|  | Example 19 | Example 20 | Example 21 |
|---|---|---|---|
| Phosphor content proportion (%) First phosphor/all phosphors | 6.7 | 12.5 | 17.6 |
| Phosphor content proportion (%) Second phosphor/all phosphors | 26.7 | 25.0 | 23.5 |
| Phosphor content ratio First phosphor/third phosphor | 0.12 | 0.24 | 0.37 |
| Phosphor content ratio Second phosphor/third phosphor | 0.48 | 0.48 | 0.48 |
| Intensity ratio of emission peaks First phosphor/light emitting element | 2.47 | 2.93 | 3.55 |
| Intensity ratio of emission peaks Second phosphor/light emitting element | 8.35 | 9.25 | 10.50 |
| Intensity ratio of emission peaks Second phosphor/first phosphor | 3.38 | 3.15 | 2.95 |
| Chromaticity x | 0.459 | 0.465 | 0.470 |
| coordinate y | 0.419 | 0.420 | 0.423 |
| Correlated color temperature (K) | 2765 | 2679 | 2646 |

TABLE 18

|  | Example 19 | Example 20 | Example 21 |
|---|---|---|---|
| Ra | 94.4 | 93.4 | 92.9 |
| R1 | 92.9 | 91.8 | 91.4 |
| R2 | 98.5 | 97.5 | 97.5 |
| R3 | 93.1 | 93.3 | 92.7 |
| R4 | 88.8 | 87.7 | 87.1 |
| R5 | 93.1 | 91.7 | 91.4 |
| R6 | 94.4 | 92.9 | 93.2 |
| R7 | 98.0 | 97.4 | 96.4 |
| R8 | 96.4 | 94.8 | 93.2 |
| R9 | 95.8 | 94.3 | 92.0 |
| R10 | 98.0 | 96.2 | 96.1 |
| R11 | 83.0 | 81.4 | 80.7 |
| R12 | 97.2 | 95.7 | 96.4 |
| R13 | 94.1 | 92.9 | 92.7 |
| R14 | 94.6 | 94.6 | 94.3 |
| R15 | 96.6 | 95.3 | 94.9 |
| Rt | 659.3 | 650.5 | 647.2 |

From Tables 15 and 16, Examples 13 to 15 enhanced Ra and R9 and achieved high color rendering indexes of 80 or higher for R10 to R15 by adding the MGF which was the first phosphor and the KSF which was the second phosphor, compared to those of Comparative Example 10. That is, the light emitting characteristics can be optionally adjusted by adjusting the added amount of the MGF, which was the first phosphor, and the KSF, which was the second phosphor, and it is easy to obtain desired characteristics.

From the perspective of the color rendering index obtained from the light emitting devices, Examples 19, 20, and 21, in which the content proportion of the first phosphor (MGF) relative to the total content of the phosphors was 6% by mass to 25% by mass and the content proportion of the second phosphor (KSF) to the total content of the phosphors was 15% by mass to 27% by mass, exhibited the Rt values of 645 or higher, and thus it was clear that Examples 19, 20, and 21 had especially excellent color rendering properties. Note that, in the Examples 19, 20, and 21, the content ratio of the first phosphor to the third phosphor was 0.12 to 0.51, and the content ratio of the second phosphor to the third phosphor was 0.32 to 0.49.

FIG. 11 is a diagram comparing the emission spectra of the light emitting devices according to Examples 19 to 21 after normalizing each of the spectra. The emission spectra of FIG. 11 show relative light emission intensity versus the wavelength. As shown in Tables 17 and 18, Examples 19, 20, and 21, in which the intensity ratio of the emission peak of the second phosphor to the emission peak of the first phosphor in the emission spectrum was 2.2 to 3.5, exhibited the Rt values of 645 or higher, and thus it was clear that Examples 19, 20, and 21 had especially excellent color rendering properties.

INDUSTRIAL APPLICABILITY

The light emitting device of the present disclosure can be used in lighting equipment, LED displays, camera flashes, and the like, which have excellent light emitting characteristics and which use a blue light emitting diode or ultraviolet light emitting diode as an excitation light source. In particular, the light emitting device of the present disclosure can be suitably used in lighting equipment and light source that are required to have a high color rendering properties.

REFERENCE SIGNS LIST

10: Light emitting element
50: Phosphor material
70: Phosphor
71: First phosphor or second phosphor
72: Third phosphor
73: Fourth phosphor
74: Fifth phosphor
100: Light emitting device As described above, it should be obvious that various other embodiments are possible without departing the spirit and scope of the present invention. Accordingly, the scope and spirit of the present invention should be limited only by the following claims.

All publications, patent applications, and technical standards mentioned in this specification are herein incorporated by reference to the same extent as if each individual publication, patent application, or technical standard was specifically and individually indicated to be incorporated by reference.

What is claimed is:

1. A light emitting device comprising:
a light emitting element having an emission peak wavelength in a wavelength range of 430 nm to 470 nm, and
a phosphor material comprising:
a first phosphor having composition represented by Formula (I) below
a second phosphor having composition represented by Formula (II) below, a third phosphor having composition represented by Formula (III) below, and
a fourth phosphor having composition represented by Formula (IV) below:

$(x-s)\text{MgO}\cdot(s/2)\text{Sc}_2\text{O}_3\cdot y\text{MgF}_2\cdot u\text{CaF}_2\cdot(1-t)\text{GeO}_2\cdot(t/2)\text{M}^t{}_2\text{O}_3:z\text{Mn}^{4+}$ (I)

$\text{Lu}_3\text{Al}_5\text{O}_{12}:\text{Ce}$ (II)

$(\text{Sr,Ca})\text{AlSiN}_3:\text{Eu}$ (III)

$(\text{Ca,Sr,Ba})_8\text{MgSi}_4\text{O}_{16}(\text{F,Cl,Br})_2:\text{Eu}$ (IV)

wherein, M$^t$ is at least one type selected from the group consisting of Al, Ga, and In; x, y, z, s, t, and u each satisfy 2≤x≤4, 0<y<1.5, 0<z<0.05, 0≤s<0.5, 0<t<0.5, and 0≤u<1.5;
wherein an intensity ratio of an emission peak of the first phosphor to an emission peak of the light emitting element in an emission spectrum is 1.60 to 2.65 or 2.75 to 3.50.

2. The light emitting device according to claim 1, wherein a content proportion of a content of the first phosphor relative to a total content of the phosphor material is 15% by mass to 48% by mass.

3. The light emitting device according to claim 1, wherein a content ratio of the first phosphor to the second phosphor is 0.2 to 1.25.

4. The light emitting device according to claim 1, wherein the light emitting element has the emission peak wavelength in a wavelength range of 440 nm to 460 nm.

5. The light emitting device according to claim 1, wherein the light emitting device emits light having a correlated color temperature of 2000 K to 3500 K.

6. The light emitting device according to claim 1, wherein a color rendering index average Ra of the light emitting device is 90 or higher.

7. The light emitting device according to claim 1, wherein all of special color rendering indexes R9, R10, R11, R12, R13, R14, and R15 of the light emitting device are 80 or higher.

8. The light emitting device according to claim 7, wherein a sum of all of the special color rendering indexes R9, R10, R11, R12, R13, R14, and R15 of the light emitting device is 645 or higher.

9. A light emitting device comprising:
a light emitting element having an emission peak wavelength in a wavelength range of 430 nm to 470 nm, and
a phosphor material comprising:
a first phosphor having composition represented by Formula (I) below,
a second phosphor having composition represented by Formula (II) below,
a third phosphor having composition represented by Formula (III) below; and
a fourth phosphor having composition represented by Formula (IV) below:

$\text{A}_2[\text{M}_{1-p}\text{F}_6]:p\text{Mn}^{4+}$ (I)

$\text{Lu}_3\text{Al}_5\text{O}_{12}:\text{Ce}$ (II)

$(\text{Sr,Ca})\text{AlSiN}_3:\text{Eu}$ (III)

$(\text{Ca,Sr,Ba})_8\text{MgSi}_4\text{O}_{16}(\text{F,Cl,Br})_2:\text{Eu}$ (IV)

wherein, A is at least one type selected from the group consisting of K, Li, Na, Rb, Cs, and NH$_4$; M is at least one type of element selected from the group consisting of group 4 elements and group 14 elements; and p satisfies 0<p<0.2;
wherein an intensity ratio of an emission peak of the first phosphor to an emission peak of the light emitting element in an emission spectrum is 3.0 to 5.0 or 7.0 to 9.0.

10. The light emitting device according to claim 9, wherein a content proportion of a content of the first phosphor relative to a total content of the phosphor material is 8% by mass to 29% by mass.

11. The light emitting device according to claim 9, wherein a content ratio of the first phosphor to the second phosphor is 0.1 to 0.5.

12. The light emitting device according to claim 9, wherein the light emitting element has the emission peak wavelength in a wavelength range of 440 nm to 460 nm.

13. The light emitting device according to claim 9, wherein the light emitting device emits light having a correlated color temperature of 2000 K to 3500 K.

14. The light emitting device according to claim 9, wherein a color rendering index average Ra of the light emitting device is 90 or higher.

15. The light emitting device according to claim 9, wherein all of special color rendering indexes R9, R10, R11, R12, R13, R14, and R15 of the light emitting device are 80 or higher.

16. The light emitting device according to claim 15, wherein a sum of all of the special color rendering indexes R9, R10, R11, R12, R13, R14, and R15 of the light emitting device is 645 or higher.

17. A light emitting device comprising:
a light emitting element having an emission peak wavelength in a wavelength range of 430 nm to 470 nm, and
a phosphor material comprising:
a first phosphor having composition represented by Formula (I) below and a second phosphor having composition represented by Formula (II) below,
a third phosphor having composition represented by Formula (III) below,
a fourth phosphor having composition represented by Formula (IV) below, and
a fifth phosphor having composition represented by Formula (V) below;

$(x-s)\text{MgO}\cdot(s/2)\text{Sc}_2\text{O}_3\cdot y\text{MgF}_2\cdot u\text{CaF}_2\cdot(1-t)\text{GeO}_2\cdot(t/2)\text{M}^t{}_2\text{O}_3:z\text{Mn}^{4+}$ (I)

$\text{A}_2[\text{M}_{1-p}\text{F}_6]:p\text{Mn}^{4+}$ (II)

$\text{Lu}_3\text{Al}_5\text{O}_{12}:\text{Ce}$ (III)

$(\text{Sr,Ca})\text{AlSiN}_3:\text{Eu}$ (IV)

$(\text{Ca,Sr,Ba})_8\text{MgSi}_4\text{O}_{16}(\text{F,Cl,Br})_2:\text{Eu}$ (V)

wherein, M$^t$ is at least one type selected from the group consisting of Al, Ga, and In; x, y, z, s, t, and u each satisfy 2≤x≤4, 0<y<1.5, 0<z<0.05, 0≤s<0.5, 0<t<0.5, and 0≤u<1.5; A is at least one type selected from the group consisting of K, Li, Na, Rb, Cs, and NH$_4$; M is at least one type of element selected from the group consisting of group 4 elements and group 14 elements; and p satisfies 0<p<0.2,
wherein an intensity ratio of an emission peak of the second phosphor to an emission peak of the first phosphor in an emission spectrum is 2.2 to 3.5.

18. The light emitting device according to claim 17, wherein a content proportion of a content of the first phosphor relative to a total content of the phosphor material is 6% by mass to 25% by mass, and a content proportion of a content of the second phosphor relative to the total content of the phosphor material is 15% by mass to 27% by mass.

19. The light emitting device according to claim 17, wherein a content ratio of the first phosphor to the third phosphor is 0.12 to 0.51, and a content ratio of the second phosphor to the third phosphor is 0.32 to 0.49.

20. The light emitting device according to claim 17, wherein the light emitting element has the emission peak wavelength in a wavelength range of 440 nm to 460 nm.

21. The light emitting device according to claim 17, wherein the light emitting device emits light having a correlated color temperature of 2000 K to 3500 K.

22. The light emitting device according to claim 17, wherein a color rendering index average Ra of the light emitting device is 90 or higher.

23. The light emitting device according to claim 17, wherein all of special color rendering indexes R9, R10, R11, R12, R13, R14, and R15 of the light emitting device are 80 or higher.

24. The light emitting device according to claim 23, wherein a sum of all of the special color rendering indexes R9, R10, R11, R12, R13, R14, and R15 of the light emitting device is 645 or higher.

* * * * *